(12) United States Patent
Tofighbakhsh et al.

(10) Patent No.: US 12,278,651 B2
(45) Date of Patent: Apr. 15, 2025

(54) SYSTEM AND METHOD FOR LOCATION BASED ERROR CORRECTING AND VIDEO TRANSCRIBING CODE SELECTION

(71) Applicant: RingCentral, Inc., Belmont, CA (US)

(72) Inventors: Mostafa Tofighbakhsh, Cupertino, CA (US); Vlad Vendrow, Reno, NV (US); Homayoun Razavi, Sausalito, CA (US)

(73) Assignee: RingCentral, Inc., Belmont, CA (US)

( * ) Notice: Subject to any disclaimer, the term of this patent is extended or adjusted under 35 U.S.C. 154(b) by 153 days.

(21) Appl. No.: 18/089,947

(22) Filed: Dec. 28, 2022

(65) Prior Publication Data

US 2024/0223218 A1  Jul. 4, 2024

(51) Int. Cl.
*H03M 13/00* (2006.01)
*H03M 13/37* (2006.01)
*H04L 1/00* (2006.01)

(52) U.S. Cl.
CPC ..... *H03M 13/635* (2013.01); *H03M 13/3738* (2013.01); *H04L 1/0045* (2013.01)

(58) Field of Classification Search
None
See application file for complete search history.

(56) References Cited

U.S. PATENT DOCUMENTS

| 11,342,937 B2 * | 5/2022 | Gabrys | G06N 20/00 |
| 2019/0181937 A1 * | 6/2019 | Nammi | H04L 1/16 |

OTHER PUBLICATIONS (Choi et al.)—"Cooperative Video Quality Adaptation for Delay-Sensitive Dynamic Streaming using Adaptive Super-Resolution"—IEEE—(Nov. 1, 2022) (Year: 2022).*

* cited by examiner

*Primary Examiner* — Mark D Featherstone
*Assistant Examiner* — Matthew W Wahlin

(57) ABSTRACT

A computer-implemented method includes receiving a plurality of data associated with a device, wherein the plurality of data includes a location data associated with the device; applying the plurality of data as an input to a trained Machine Learning (ML) model to determine an error correcting code to be used for the device based on an output of the selected ML model; and sending the error correcting code to the device.

17 Claims, 10 Drawing Sheets

US 12,278,651 B2

SYSTEM AND METHOD FOR LOCATION BASED ERROR CORRECTING AND VIDEO TRANSCRIBING CODE SELECTION

TECHNICAL FIELD

The present disclosure relates generally to the field of telecommunication. Specifically, the present disclosure relates to systems and methods for dynamically selecting an appropriate error correcting code and/or percentage of error correction utilizing Artificial Intelligence (AI)/Machine Learning (ML) inferences.

BACKGROUND

Mobile communication, e.g., electronic data, video data, audio data, etc., has become an essential aspect of modern life. There are many factors that impact the quality of communication, e.g., various users competing for resources such as bandwidth, location of a user and proximity to a signal transmitter/receiver, type of network (e.g., 5G, Starlink, etc.), etc. Unfortunately, many of the factors that impact the quality of communication changes over time and is dynamic in nature. Moreover, systems are generally designed to address the quality of communication for the worst performers. For example, the system may be designed with a particular error correction regardless of whether a particular user needs that particular error correction based the user's circumstance. In other words, the industry generally applies a one-size-fits-all approach, which may lead to certain performance degradation, e.g., using a higher percentage for error correction may improve the system's reliability but it may increase delay and unnecessary overhead due to the number of redundant bits that are introduced. As yet another example, it is common practice in the industry to apply the same link level optimization regardless of the network load, congestions, etc., while in some examples the end device may negotiate rates, protocols, and link level optimization, none of which is based on particular factors associated with the user and user's device.

SUMMARY

Accordingly, a need has arisen to dynamically adapt the error correction code (and/or selection thereof) for communication associated with a given user based on user location to increase data reliability and provide best user experience, e.g., voice, video, etc. The appended claims may serve as a summary of the invention.

DETAILED DESCRIPTION

Figure 1A:
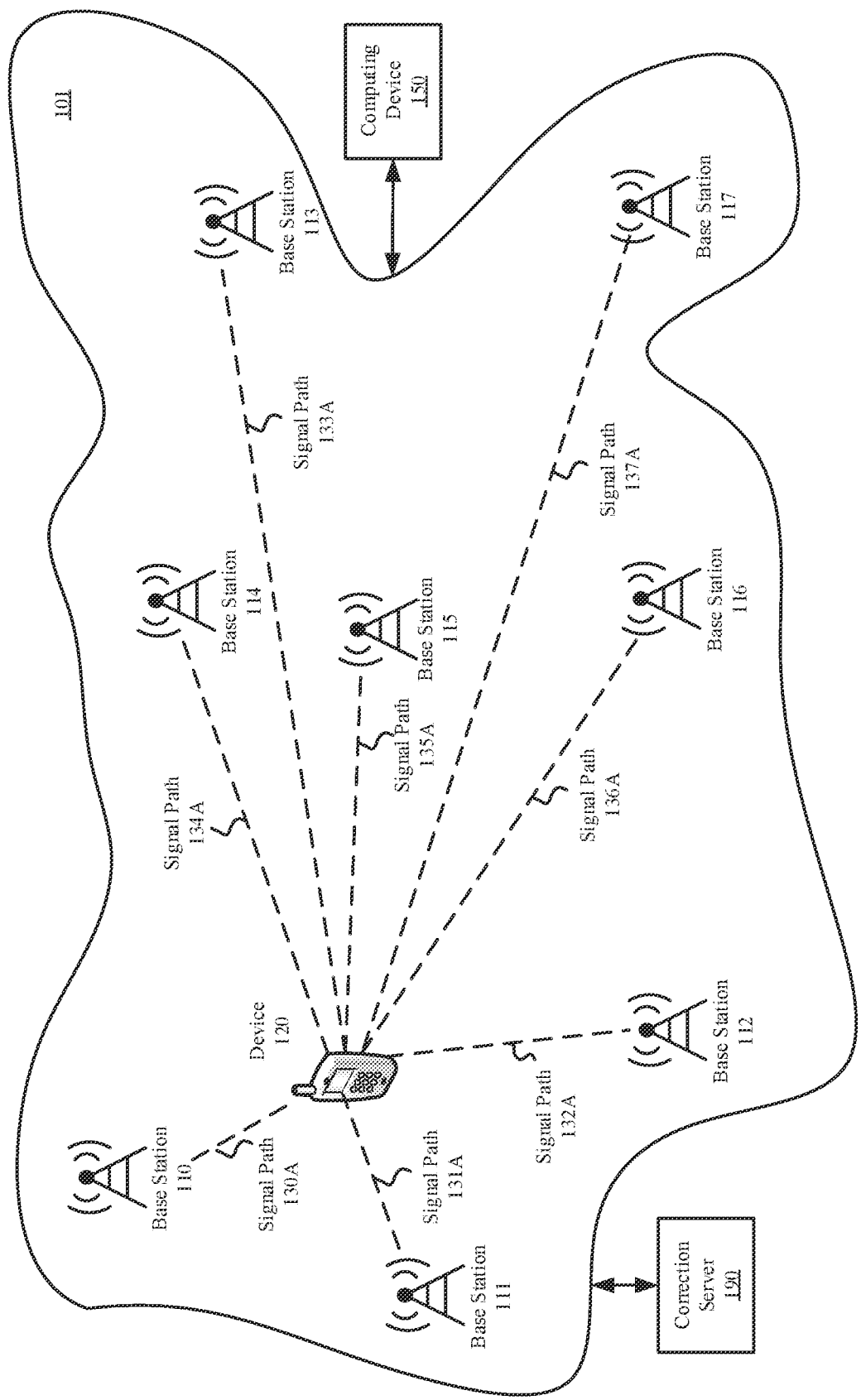
FIG. 1A is a diagram of a communication system and coverage map associated with a user in a first instance in time in accordance with some embodiments of the present disclosure.

Before various example embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing concepts, and the terminology is not intended to be limiting. Unless defined otherwise, all technical and scientific terms used herein have the same meaning as commonly understood by those skilled in the art to which the embodiment pertains.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that the singular forms of "a," "an," and "the" include plural references unless the context clearly dictates otherwise.

Some portions of the detailed descriptions that follow are presented in terms of procedures, methods, flows, logic blocks, processing, and other symbolic representations of operations performed on a computing device or a server. These descriptions are the means used by those skilled in the arts to most effectively convey the substance of their work to others skilled in the art. In the present application, a procedure, logic block, process, or the like, is conceived to be a self-consistent sequence of operations or steps or instructions leading to a desired result. The operations or steps are those utilizing physical manipulations of physical quantities. Usually, although not necessarily, these quantities take the form of electrical, optical or magnetic signals capable of being stored, transferred, combined, compared, and otherwise manipulated in a computer system or computing device or a processor. These signals are sometimes referred to as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "storing," "determining," "sending," "receiving," "generating," "creating," "fetching," "transmitting," "facilitating," "providing," "forming," "detecting," "processing," "updating," "instantiating," "identifying", "contacting", "gathering", "accessing", "utilizing", "resolving", "applying", "displaying", "requesting", "monitoring", "changing", "updating", "establishing", "initiating", "selecting", "causing", "storing", or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

A "computer" is one or more physical computers, virtual computers, and/or computing devices. As an example, a computer can be one or more server computers, cloud-based computers, cloud-based cluster of computers, virtual machine instances or virtual machine computing elements such as virtual processors, storage and memory, data centers, storage devices, desktop computers, laptop computers, mobile devices, Internet of Things (IoT) devices such as home appliances, physical devices, vehicles, and industrial equipment, computer network devices such as gateways, modems, routers, access points, switches, hubs, firewalls, and/or any other special-purpose computing devices. Any reference to "a computer" herein means one or more computers, unless expressly stated otherwise.

The "instructions" are executable instructions and comprise one or more executable files or programs that have been compiled or otherwise built based upon source code prepared in JAVA, C++, OBJECTIVE-C or any other suitable programming environment.

Communication media can embody computer-executable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared and other wireless media. Combinations of any of the above can also be included within the scope of computer-readable storage media.

Computer storage media can include volatile and nonvolatile, removable and non-removable media implemented in any method or technology for storage of information such as computer-readable instructions, data structures, program modules, or other data. Computer storage media can include, but is not limited to, random access memory (RAM), read only memory (ROM), electrically erasable programmable ROM (EEPROM), flash memory, or other memory technology, compact disk ROM (CD-ROM), digital versatile disks (DVDs) or other optical storage, solid state drives, hard drives, hybrid drive, or any other medium that can be used to store the desired information and that can be accessed to retrieve that information.

It is appreciated that present systems and methods can be implemented in a variety of architectures and configurations. For example, present systems and methods can be implemented as part of a distributed computing environment, a cloud computing environment, a client server environment, hard drive, etc. Example embodiments described herein may be discussed in the general context of computer-executable instructions residing on some form of computer-readable storage medium, such as program modules, executed by one or more computers, computing devices, or other devices. By way of example, and not limitation, computer-readable storage media may comprise computer storage media and communication media. Generally, program modules include routines, programs, objects, components, data structures, etc., that perform particular tasks or implement particular data types. The functionality of the program modules may be combined or distributed as desired in various embodiments.

A term conference session means, without limitation, two or more people communication using audio and/or video communication means through any type of user device or virtual reality techniques, any type of webinar or any type of podcast or any type of recorded video/audio stream.

It is appreciated that users may be mobile, yet requiring communication, e.g., data, voice data, video data, etc., whether during a conference session or not. As users' location change their condition also change. For example, users may find themselves in different conditions, e.g., indoor, outdoors, top of the building, in the basement, underground, underserved network situation, etc. Users may be traveling at a given speed, acceleration, etc., and may be competing for certain resources, e.g., bandwidth, with other users that impacts the reliability of their data communication.

As discussed above, a need has arisen to improve communications and user experience, by adding and/or adjusting the appropriate error correction code, and/or by adaptively transcoding the data that is being transmitted based on various user factors, e.g., user location, device type, speed at which the user is traveling, acceleration at which the user is traveling, density of other users within a given geographical location, load/congestion of network, connectivity type, network type (e.g., 5G), weather, signal fade, proximity/direction to signal source (e.g. WiFi access point, base station, satellite such as Starlink, etc.), time of day, error correction code being used (if any), etc. In some embodiments, the appropriate error correction code may be injection of forward error correction (FEC) and/or changing the percentage of FEC functions, e.g., changing the redundancy, etc. In yet some embodiments, an appropriate data transcoding, e.g., mp3, wav, UTF-8, ISO/IEC 8859, etc., may be selected. As such, data reliability and user experience is improved by customizing the appropriate error correction code and/or data transcoding based on user's specific circumstances (e.g., user/device location), thereby moving away from one size fit all and rather more tailored approach unique to each user.

The proposed system may collect various factors to generate a Machine Learning (ML) model associated with the coverage map. For example, factors may include user location data (e.g., location, indoor vs. outdoor, speed, acceleration, direction etc.), device type data, time data (time of day communication is taking place), error correction code being used (if any), and/or other factors including environmental data which may include density of other users within a given geographical location, load/congestion of network, connectivity type, network type (e.g., 5G), weather, signal fade, proximity/direction to signal source (e.g., WiFi access point, base station, satellite such as Starlink, etc.), etc. The output of the ML model may be an appropriate error correction code and/or modification thereto and/or appropriate transcoding to be used.

Once the ML model is generated, an appropriate error correction code and/or transcoding may be determined for each user in a dynamic and customized fashion. For example, various information associated with the user/s engaged in communication is collected, e.g., user/s location, device type, speed at which the user is traveling, acceleration at which the user is traveling, density of other users within a given geographical location, load/congestion of network, connectivity type, network type (e.g., 5G), weather, signal fade, proximity/direction to signal source (e.g. WiFi access point, base station, satellite such as Starlink, etc.), time of day, error correction code being used (if any), etc. The collected information is used as input to select an ML model from a plurality of ML models. Once the ML model most appropriate for the user is selected, the most appropriate error correction code and/or modification thereto (e.g., changing the percentages and the number of redundancies) and/or the appropriate transcoding to be used may be determined and adaptively communicated to the transmit source and receiver.

Accordingly, each user may be classified based on various factors, e.g., location data, device type data, environmental data, etc., and the most appropriate error correction code and/or percentage of error correction or modification thereto, and/or appropriate transcoding may be selected/negotiated between source and destination. It is appreciated that once the appropriate error correction code is selected and/or modification thereto is determined and/or the appropriate transcoding is selected, then the server may inject the selected appropriate error correction code or its modification and/or appropriate transcoding to be used in communication with the user. In other words, the source and the target now utilize the appropriate error correction code and/or modifications thereto, as determined by the server, when communicating with one another. It is appreciated that in some embodiments, specific transcoding format, appropriate error correction code (e.g., FEC, redundancy percentage, etc.), etc., is selected and the source and the target utilize the selection during their communication. As an example, a user may be attending a webinar and it may be determined that the source and/or the target (i.e., user) is at an unstable environment/location. The system (e.g., server) may determine that injecting an FEC code with 10% redundancy can improve the data reliability, thereby improving Service Level Agreement (SLA) and Quality of Experience (QOE) while introducing a slight delay of 100 millisecond. Accordingly, error correcting code selection and/or modification thereto, and/or transcoding data can occur dynamically and tailored to each user's needs as opposed to the conventional approach of one size fit all.

According to some embodiments, feedback data, e.g., user provided feedback associated with communication quality and/or location, device provided feedback associated with monitored quality and/or automatic location detection, system provided feedback, etc., may be further used to modify the selection, e.g., changing the redundancy percentages, etc. In some embodiments, the ML model(s) are periodically updated by the back-end ML training that learns the most appropriate error correction code and/or modification thereto at each specific location or proximity at different times.

It is appreciated that throughout the application the embodiments and examples are described with respect to FEC. However, references to FEC and percentages of redundancies associated with FEC is for illustration purposes only and should not be construed as limiting the scope of the embodiments. For example, any error correction code, e.g., turbo codes, low-density parity-check code, block codes, convolutional codes, etc., and/or percentage redundancies may be used.

Turning now to FIG. 1A, a diagram of a communication system and coverage map associated with a user in a first instance in time in accordance with some embodiments of the present disclosure. In this example, a device 120 may be associated with a user on a move at time $t_0$. The device 120 may be within an indoor or outdoor geographical location 101 with various base stations, e.g., base stations 110-117. It is appreciated that in this nonlimiting example, base stations are discussed for illustration purposes only and the embodiments should not be construed as limiting the scope of the embodiments. For example, the network may further include WiFi access point, satellite links, etc. In this nonlimiting example, the device 120 is in contact with base stations 110-117 through signal paths 130A-137A respectively, that provide a communication network for illustration purposes only and should not be construed as limiting the scope of the embodiments. For example, WiFi access point, satellite link, base station, or any combination thereof may provide a communication network.

The base stations 110-117 may be any type of network that provides communications, exchanges information, and/or facilitates the exchange of information between the computing device 150 and device 120. For example, the network may be the Internet, a Local Area Network, a cellular network, a public switched telephone network ("PSTN"), or other suitable connection(s) to send and receive information between device 120 and other users and/or other components, e.g., computing device 150. A network may support a variety of electronic messaging formats and may further support a variety of services and applications for device 120.

It is appreciated that the computing device 150 may be a computer-based system including computer system components, desktop computers, workstations, tablets, hand-held computing devices, memory devices, and/or internal network(s) connecting the components, which may be configured to provide conference services, such as setting up conference sessions for users. The computing device 150 may include a bus, one or more processors that may implement virtual machine technologies, or other technologies to provide the ability to execute, control, run, manipulate, store, etc. multiple software processes, applications, programs, etc., input/output ("I/O") devices, network interface (e.g., a modem, Ethernet card, or any other interface configured to exchange data with the network), and one or more memories, e.g., volatile or non-volatile, magnetic, semiconductor, tape, optical, removable, non-removable, or other type of storage device or tangible or non-transitory computer-readable medium that stores one or more program(s), storing programs including, for example, server app(s), operating system (e.g., Microsoft Windows™, Unix™, Linux™, Apple™ operating systems, Personal Digital Assistant (PDA) type operating systems, such as Apple iOS, Google Android, Blackberry OS, or other types of operating systems), and data, and can communicate with an internal/ external database. The database may be a volatile or non-volatile, magnetic, semiconductor, tape, optical, removable, non-removable, or other type of storage device or tangible or non-transitory computer-readable medium. The database may be controlled by memory controller devices (e.g., server(s), etc.) or software, such as document management systems, Microsoft SQL databases, SharePoint databases, Oracle™ databases, Sybase™ databases, or other relational databases. Common forms of non-transitory media include, for example, a flash drive, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. The computing device 150 may be a single server or may be configured as a distributed computer system including multiple servers, server farms, clouds, or computers that interoperate to perform one or more of the processes and functionalities associated with the disclosed embodiments.

It is appreciated that the device 120 may be used to communicate, e.g., video data, voice data, content data, etc., with other devices (e.g., computing device 150). In other words, the device 120 enables the user to participate in a conference session, e.g., video, call, webinar, etc., through computing device 150. For example, the computing device 150 may be a conference management system, enabling a plurality of users to schedule conferences, run conferences and record conferences. In some examples, the computing device 150 may be a conference management server that is used to implement computer programs, applications, methods, processes, or other software to facilitate communication between the device 120 and other user(s) (e.g., participants). It is appreciated that only one device 120 is shown for illustrative purposes and should not be construed as limiting the scope of the embodiments. For example, a plurality of devices may be within the given geographical area 101. It is appreciated that the device 120 may be a display such as a television, tablet, computer monitor, video conferencing console, or laptop computer screen. It is further appreciated that the device 120 may also include video/audio input devices such as a video camera, web camera, or the like. As another example, device 120 may be a mobile device such as a tablet or a smartphone having display and video/audio capture capabilities. It is appreciated that device 120 may also include one or more software applications that facilitate the user device to engage in communications, such as IM, text messages, EMAIL, VOIP, video conferences, with one another.

Accordingly, device 120 may be in communication with the computing device 150 and transmit and/or receive content, e.g., conference content, audio, video, etc. It is appreciated that the computing device 150 may be a selective forwarding unit (SFU) or a multi-cast unit (MCU) or any other forwarding unit, including satellite systems like Starlink.

At time $t_0$, the user associated with device 120 may be in communication with another device, e.g., the computing device 150, another user device, etc. It is appreciated that a correction server 190 may collect various information associated with device 120 and dynamically determine whether a forward error correction (e.g., FEC) code needs to be injected. The correction server 190 may dynamically determine whether the percentage (i.e., redundancies) of the error correction code should be changed based on the collected information associated with device 120. In some embodiments, the correction server 190 may dynamically determine the kind of transcoding to be used based on the collected information. It is appreciated that the determination (i.e., whether to use a particular error correction code, whether to modify the percentage of redundancy for the error correction code, whether to use transcoding and the type of transcoding to use, etc.) by the correction server 190 is based on ML models (generation of ML models is described in great detail in FIGS. 2A-2B and 3). As such, there is no need for continuous monitoring of network connectivity and performance but rather the generated ML models may be used to determine the appropriate action to be taken, e.g., proper error correction code to be injected, proper percentage of redundancies to be used for the error correction code, proper transcoding, etc. Various factors and information collected by the correction server 190 include one or more of user location data (e.g., location, speed, acceleration, etc.), device type data, time data (time of day communication is taking place), error correction code being used (if any), and/or other factors including environmental data which may include density of other users within a given geographical location, load/congestion of network, connectivity type, network type (e.g., 5G), weather, signal fade, proximity/direction to signal source (e.g. WiFi access point, base station, satellite such as Starlink, etc.), etc.

Accordingly, the generated ML models once made available can be used to determine a particular error correction code, percentage of redundancies for the error correction code (and modification thereto), particular transcoding to use, etc., based on the collected information associated with device 120. It is appreciated that since the collected information associated with each device is unique to that device, the correction server 190 may make a different determination for different devices even though they may or may not be within close proximity to one another. In other words, determination of whether to use a particular error correction code, the percentage associated with the redundancies for the error correction code, and/or the transcoding is based on each device and their respective circumstances. In other words, devices are not treated as one size fit all to have the same error correction code, as an example.

The correction server 190 may inject the appropriate error correction code, percentage of redundancy, and/or proper transcoding for device 120 based on the collected information. In some embodiments, the appropriate error correction code may be injection of FEC and/or changing the percentage of FEC functions, e.g., changing the redundancy, etc. In yet some embodiments, an appropriate data transcoding, e.g., mp3, wav, UTF-8, ISO/IEC 8859, etc., may be selected. Moreover, as the device 120 moves from one location to another location, the changes (e.g., percentage of redundancies) may be made to the error correction code that was previously selected and/or the particular type of transcoding that was used. In other words, the system dynamically modifies the error correction code selection, percentage of redundancies, and/or transcoding as the circumstances (e.g., location, speed, acceleration, etc.) for device 120 changes. As such, data reliability and user experience is improved by customizing the appropriate error correction code and/or data transcoding based on user's specific circumstances, thereby moving away from the one-size-fits-all approach and rather towards a more tailored approach unique to each user.

It is appreciated that transcoding may be video transcoding and refers to conversion from one digital encoding format to another, such as for movie data files. It is appreciated that video transcoding may translate file format, video format, and audio format at the same time Itis appreciated that video transcoding may be needed when a target device, e.g., device 120, does not support the current media format, or if there are limitations on storage capacity that may require a reduced file size (think going from WMV to MP4). In yet some examples, video transcoding may be used to convert incompatible or obsolete data to a better-supported, read newer, video format Moreover, it is appreciated that video transcoding may be advantageous when reaching multiple end users, e.g., in a webinar setting. In one nonlimiting example, the computing device 150 may be live streaming, e.g., presentation, webinar, etc., using a webcam audio/video with browser-based desktop application, e.g., Adobe Flash that generates 1080p H.264 video and Speex audio. It is appreciated that the content may be delivered live to online viewers, e.g., device 120, however, streaming directly to device 120 may encounter a problem, e.g., insufficient bandwidth may result in the content being unavailable, resulting in buffering without it being resolved. As another example, rendering the Speex audio may need Flash Player on a computer, and as such any device (e.g., tablets, mobile phones, etc.) with slower data speeds is excluded and incapable of rendering the audio. It is appreciated that video transcoding may be used to create a set of time-aligned video streams with different bitrate and frame size while converting the Speex audio to AAC audio, thereby enabling devices with different capabilities and in different circumstances (e.g., insufficient bandwidth) to be reached. In some embodiments, transcoding may be a two step process where the original content is first decoded to an uncompressed format before it is encoded into the target format It is appreciated that the correction server 190 may be a computing device similar to the computing device 150. In one nonlimiting example, the correction server 190 is integrated within the computing device 150. In this nonlimiting example, the correction server 190 is shown as a separate device from the computing device 150 for illustrative purposes only and should not be construed as limiting the scope of the embodiments.

It is appreciated that the information collected by the correction server 190 may be collected through various means. For example, location data may be collected from a GPS coordinate of the device 120 and provided by device 120. In some examples, the device generated location may be complemented with user provided data, e.g., user associated with device 120 may indicate that the user is in a basement/rooftop/second floor/highway/mountain/etc. In yet another example, additional location data may be collected from triangulation of base stations, based on signal strength, based on satellite link, based on WiFi access point, etc. In yet some embodiments, the location data may include information such as speed, acceleration, direction, etc., associated with user travel path (for example, position of the device 120 is changed in FIG. 1B to illustrate the user travelling from one position to another position, having a direction, speed, acceleration, etc.).

It is appreciated that device 120 may provide the device type, e.g., manufacturer, model, serial number, etc. Moreover, the device 120 may also indicate whether it is currently using any error correction code and if so the percentage of redundancy associated with the code. Similarly, the device 120 and/or the computing device 150 and/or base stations may provide the kind of transcoding that it being used. The device 120 and/or the computing device 150 may provide the time data (time of day communication is taking place) or the information may be derived through the timestamp associated with packets being transmitted to/from the device 120. In some embodiments, the network (e.g., collection of base stations and/or WiFi access points and/or satellites, etc.) may provide information with respect to load/congestion of the network, connectivity type (e.g., WiFi, Cellular, satellite, etc.), network type (e.g., 5G), etc. In some embodiments, the device 120 and/or the network may provide information associated with signal fade, proximity/direction to signal source. It is appreciated that the weather-related data may be collected from the device 120 itself, e.g., using its location, using a thermometer, etc., and/or using the location information associated with the device 120 and cross referencing the location with publicly available weather information, e.g., weather in Belmont.

Figure 1B:
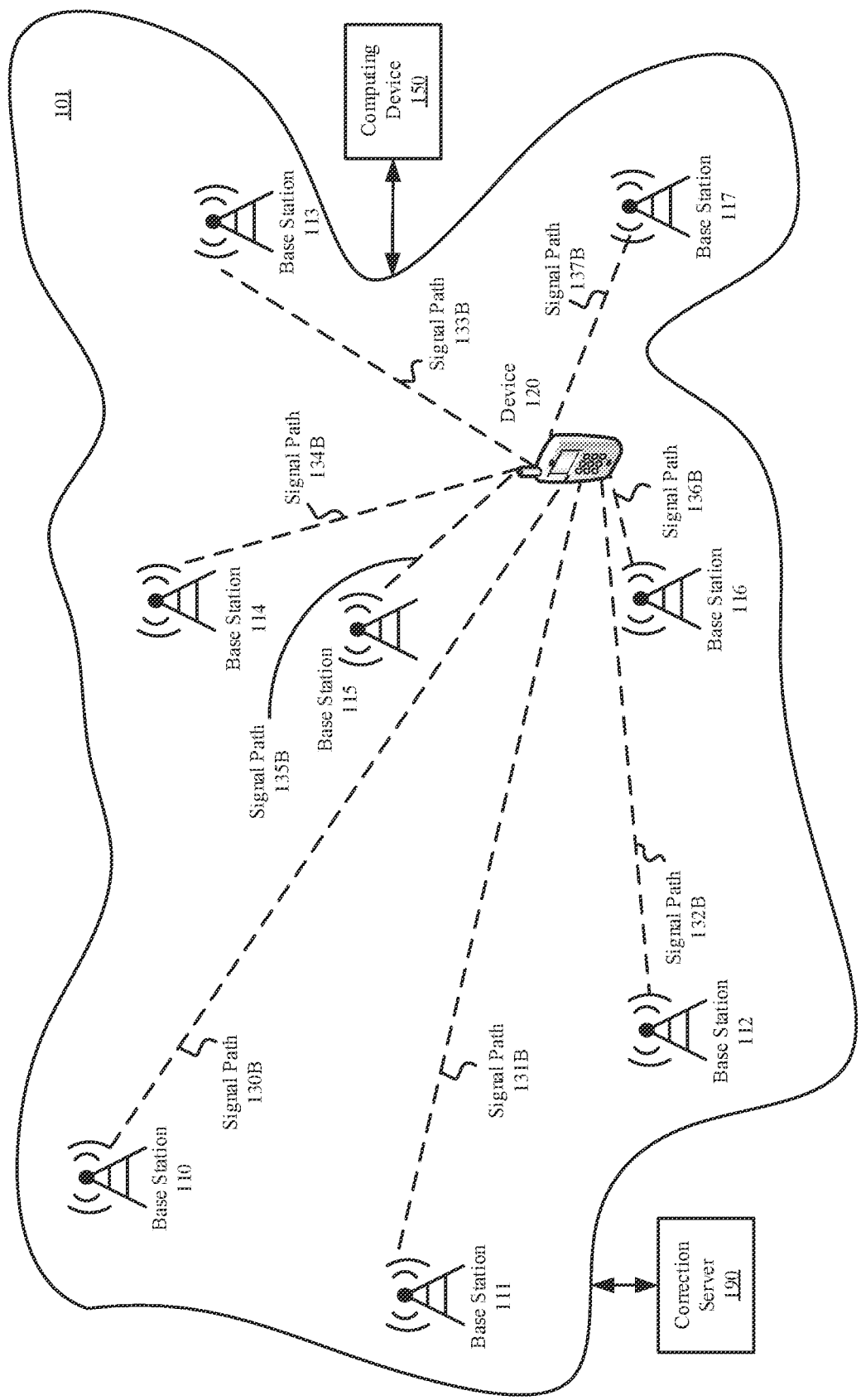
FIG. 1B is a diagram of a communication system and coverage map associated with a user in a second instance in time in accordance with some embodiments of the present disclosure.

Referring now to FIG. 1B, is a diagram of a communication system and coverage map associated with a user in a second instance in time in accordance with some embodiments of the present disclosure. At time ti subsequent to $t_0$, the device 120 has moved from its original location of FIG. 1A to a new location shown in FIG. 1B. As such, data associated with the new location for device 120 is collected and transmitted to the correction server 190. For example, various data associated with the new signal paths 130B-137B may be collected. In one nonlimiting example, signal fading information may be collected. Moreover, the location for the device 120 may be updated. Additionally, the speed, acceleration, direction, time of day, weather data, etc., may be updated. The correction server 190 may input the collected data to the generated ML models and determine whether a change to the communication should be made to improve reliability and performance. For example, the correction server 190 may utilize the ML models to determine whether an error correction code is to be used (if one was not used before), and if so, what would be the appropriate percentage for redundancies. Moreover, the ML models may be utilized to determine the appropriate transcoding for device 120. As such, the correction server 190 performs substantially similar processes to that of FIG. 1A but with new and updated information. As an example, a user may be attending a webinar and it may be determined that the source and/or the target (i.e., user) is at an unstable environment/location (in FIG. 1B). The correction server 190 may determine that injecting an FEC code with 10% redundancy can improve the data reliability, thereby improving Service Level Agreement (SLA) and Quality of Experience (QOE) while introducing a slight delay of 100 millisecond. It is appreciated that the correction server 190 may cause the source and the target (i.e., device 120) to use appropriate error correction code and appropriate redundancy percentages. In one nonlimiting example, the correction server 190 may cause the source (e.g., computing device 150) to change its transcoding when communicating with device 120.

Figure 2A:
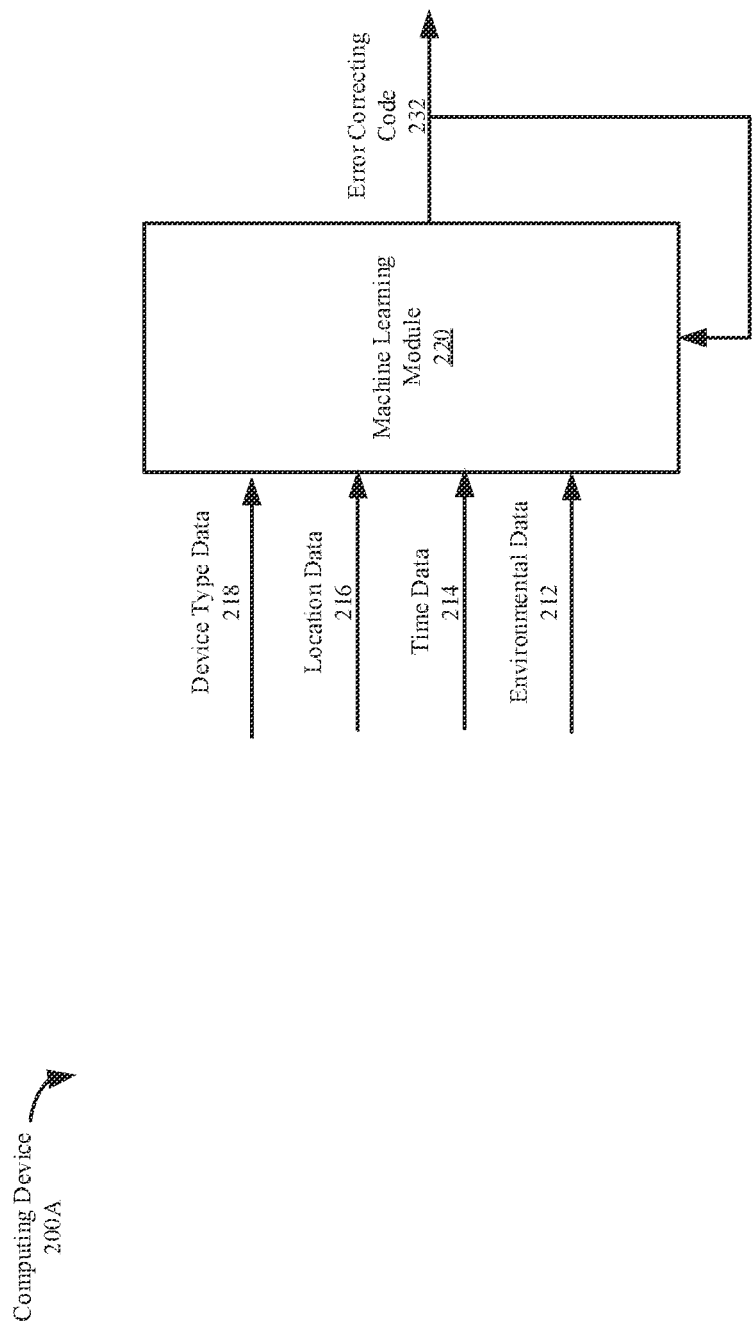
FIG. 2A is a diagram of a computing device for dynamic selection of appropriate error correction code and/or transcoding for a given user based on various factors in accordance with some embodiments of the present disclosure.

FIG. 2A is a diagram of a computing device 200A for dynamic selection of appropriate error correction code and/or transcoding for a given user based on various factors in accordance with some embodiments of the present disclosure. The computing device 200A may be similar to that of correction server 190. In one nonlimiting example, the computing device 200A may reside within the correction server 190 and in one nonlimiting example it may be separate from the correction server 190. The computing device 200A collects various information associated with device 120 in an unsupervised learning model. For example, device type data 218, location data 216, time data 214, and environmental data 212 may be collected (similar to collection of information described in FIGS. 1A-1B). The device type data 218 may include information such as manufacturer, model, serial number, etc. The location data 216 may include locational information as described above with respect to FIGS. 1A and 1B. The time data 214 may be associated with the time of data transmission and derived from timestamp of the data as an example. The environmental data 212 is also described with respect to FIGS. 1A-1B. The collected information may be fed into the ML module 220 of the computing device 200A to generate one or more ML models. The output of the ML model may be the appropriate error correcting code 232, e.g., FEC, redundancy percentages, etc., for a given ML model. It is appreciated that each ML model may have its corresponding inputs and its associated output. As such, once the ML models are trained, the appropriate trained ML model may be selected, and live data may be fed as input to determine the proper output, e.g., proper error correcting code, redundancy percentages, etc. In some embodiments, the ML models are generated using supervised training data, semi-supervised training data, and in some embodiments unstructured learning may be used. In supervised ML, the training data is known, and the ML models is generated from the known training data. It is appreciated that in some optional embodiments, the output of the ML module 220, e.g., error correcting code 232, may be fed back into the ML module 220 as yet another input to evaluate the performance of the ML model over time and to retrain the ML model if necessary.

Figure 2B:
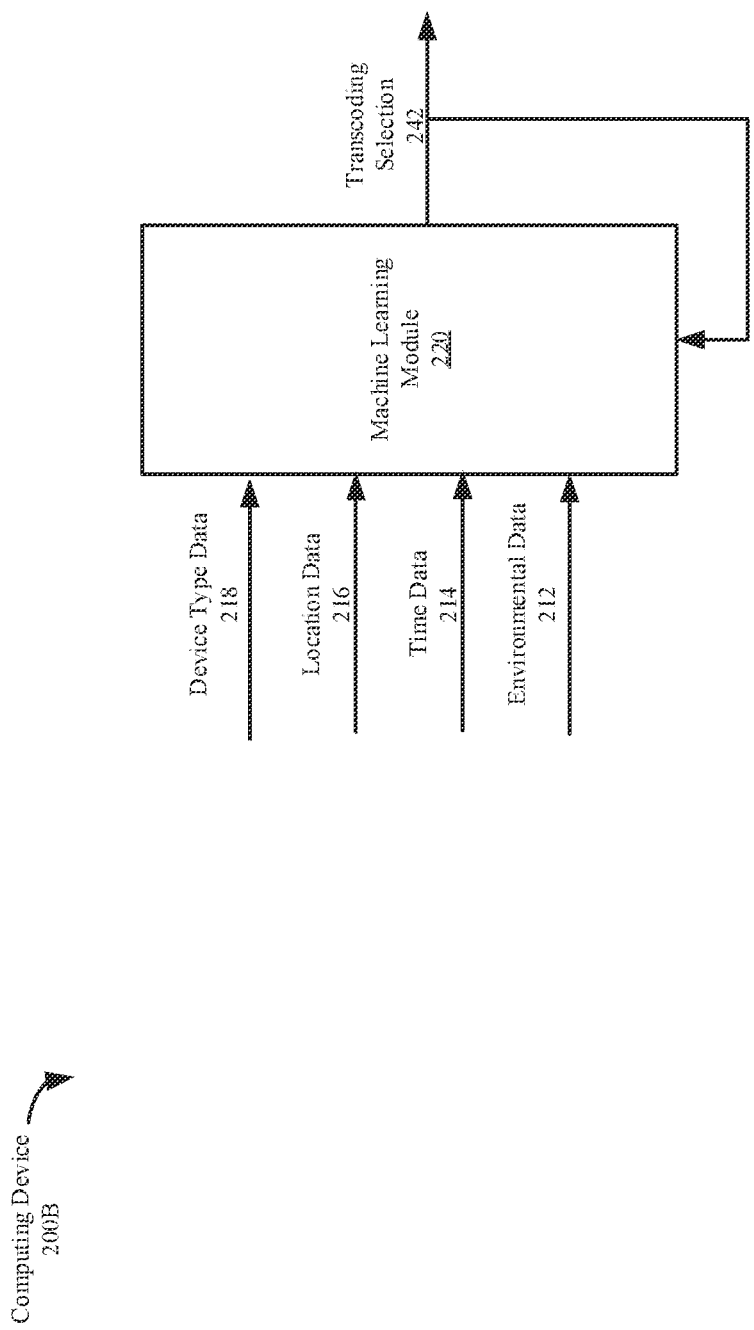
FIG. 2B is a diagram of a computing device for dynamic selection of appropriate error correction code and/or transcoding for a given user based on various factor in accordance with some embodiments of the present disclosure.

FIG. 2B is a diagram of a computing device for dynamic selection of appropriate error correction code and/or transcoding for a given user based on various factor in accordance with some embodiments of the present disclosure. The computing device 200B is similar to that of computing device 200A except that the ML models are generated to select the appropriate transcoding selection 242. The operation of the ML module 220 and its inputs in FIG. 2B are substantially the same as that of FIG. 2A, described above.

It is appreciated that for each location, a plurality of ML models may be generated where each ML model may determine the appropriate error correcting code, the appropriate percentage of redundancy to use, the appropriate transcoding, etc., based on other factors, e.g., device type, environmental data, time of day, etc. In other words, at each location multiple ML models are generated based on various inputs, e.g., device type data, time data (time of day communication is taking place), error correction code being used (if any), and/or other factors including environmental data that may include speed at which the user is traveling, acceleration at which the user is traveling, density of other users within a given geographical location, load/congestion of network, connectivity type, network type (e.g., 5G), weather, signal fade, proximity/direction to signal source (e.g. WiFi access point, base station, satellite such as Starlink, etc.), etc. Accordingly, for the same location multiple ML models may be used and the appropriate ML model based on data associated with a particular device and/or environmental data may be selected. The selected ML model is then used to determine the appropriate error correcting code, the appropriate redundancy percentage, and/or proper transcoding to use.

It is appreciated that the number of inputs to the ML module 220 is for illustration purposes only and should not be construed as limiting the scope of the embodiments. For example, fewer input data or more input data than the ones illustrated may be collected and provided as input to the ML module 220. Moreover, it is appreciated that the particular types of input described above with respect to generation of the ML models is for illustration purposes only and should not be construed as limiting the scope of the embodiments. For example, other types of input data such as application type, average distance between devices within a given geographical location, total number of devices of a given type in proximities of a particular device, etc., may also be used in generating the ML models.

Figure 3:
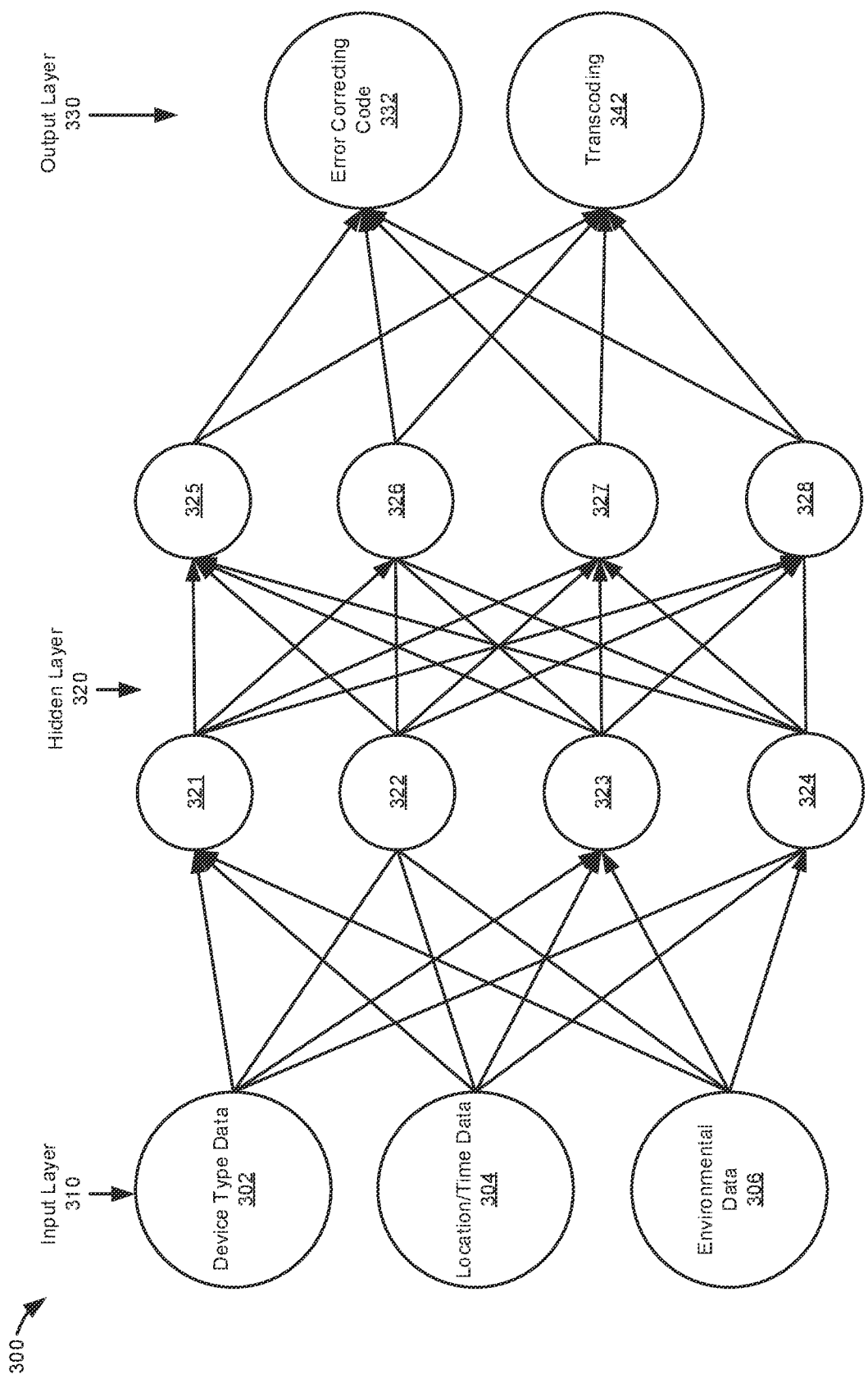
FIG. 3 is a diagram of one Machine Learning (ML) technique in accordance with some embodiments of the present disclosure.

In an embodiment, machine learning may be used to train the computing device 200A or 200B to determine the appropriate error correcting code, percentage of the redundancy thereof, and/or appropriate transcoding to use. Referring to FIG. 3, a neural network 300 may utilize an input layer 310, one or more hidden layers 320, and an output layer 330 to train a machine learning algorithm or model to determine the appropriate error correcting code, percentage of the redundancy thereof, and/or appropriate transcoding to use. In some embodiments, supervised learning is used such that known input data, a weighted matrix, and know output data is used to gradually adjust the model to accurately compute the already known output. In other embodiments, where input layer 310 and/or the output layer 330 are not known, unstructured learning may be used such that a model attempts to reconstruct known input data over time in order to learn.

Training of the neural network 300 using one or more training input matrices, a weight matrix and one or more known outputs is initiated by one or more computers associated with the computing device 200A/200B. For example, the computing device 200A/200B may be trained by one or more training computers and, once trained, used in association with the user device 120. In an embodiment, a computing device may run known input data through a deep neural network 300 in an attempt to compute a particular known output. For example, a server computing device uses a first training input matrix and a default weight matrix to compute an output. If the output of the deep neural network does not match the corresponding known output of the first training input matrix, the server adjusts the weight matrix, such as by using stochastic gradient descent, to slowly adjust the weight matrix over time. The server computing device then re-computes another output from the deep neural network with the input training matrix and the adjusted weight matrix. This process continues until the computer output matches the corresponding known output. The server computing device then repeats this process for each training input dataset until a fully trained model is generated.

In the example of FIG. 3, the input layer 312 includes a plurality of training datasets that are stored as a plurality of training input matrices in an associated database. The training input data includes, for example, device type data 302, location/time data 304, and environmental data 306. The device type data 302, the location/time data 304, and the environmental data 306 are substantially similar to those described above with respect to FIGS. 1A-2B. While the example of FIG. 3 uses a single neural network, in some embodiments, separate neural networks 300 would be trained to identify the appropriate error correcting code, its percentage of redundancy, and/or appropriate transcoding, from each of the different types of input data. For example, one neural network 300 would be trained to identify the appropriate error correcting code, its percentage of redundancy, and/or appropriate transcoding, from location/time data while another neural network 300 would be trained to identify the appropriate error correcting code, its percentage of redundancy, and/or appropriate transcoding, from the device type data, another neural network 300 would be trained to identify the appropriate error correcting code, its percentage of redundancy, and/or appropriate transcoding, from the environmental data, and so forth. Any number of neural networks, in any combination, may be used to train the correction server 190 to identify the appropriate error correcting code, its percentage of redundancy, and/or appropriate transcoding.

In the embodiment of FIG. 3, hidden layers 320 represent various computational nodes 321, 322, 323, 324, 325, 326, 327, 328. The lines between each node 321, 322, 323, 324, 325, 326, 327, 328 represent weighted relationships based on the weight matrix. As discussed above, the weight of each line is adjusted overtime as the model is trained. While the embodiment of FIG. 3 features two hidden layers 320, the number of hidden layers is not intended to be limiting. For example, one hidden layer, three hidden layers, ten hidden layers, or any other number of hidden layers may be used for a standard or deep neural network. The example of FIG. 3 also features an output layer 330 with error correcting code 332 and transcoding 342 as the known output. The error correcting code 332 identifies the appropriate error correcting code to use and its appropriate redundancy during communication. The transcoding 342 identifies the appropriate transcoding to use during communication. As discussed above, in this structured model, the error correcting code 332 and transcoding 342 are used as a target output for continuously adjusting the weighted relationships of the model. When the model successfully outputs the error correcting code 332 and transcoding 342, then the model has been trained and may be used to process live or field data.

Once the neural network 300 of FIG. 3 is trained, the trained correction server 190 will accept field data at the input layer 310, such as the device type data 302, location/time data 304, and environmental data 306. In some embodiments, the field data is live data that is accumulated in real time, such as data collection as device 120 is communicating with the computing device 150. In other embodiments, the field data may be current data that has been saved in an associated database or it may be real-time data. The trained correction server 190 is applied to the field data in order to identify the appropriate error correcting code and/or transcoding at the output layer 330.

Figure 4A:
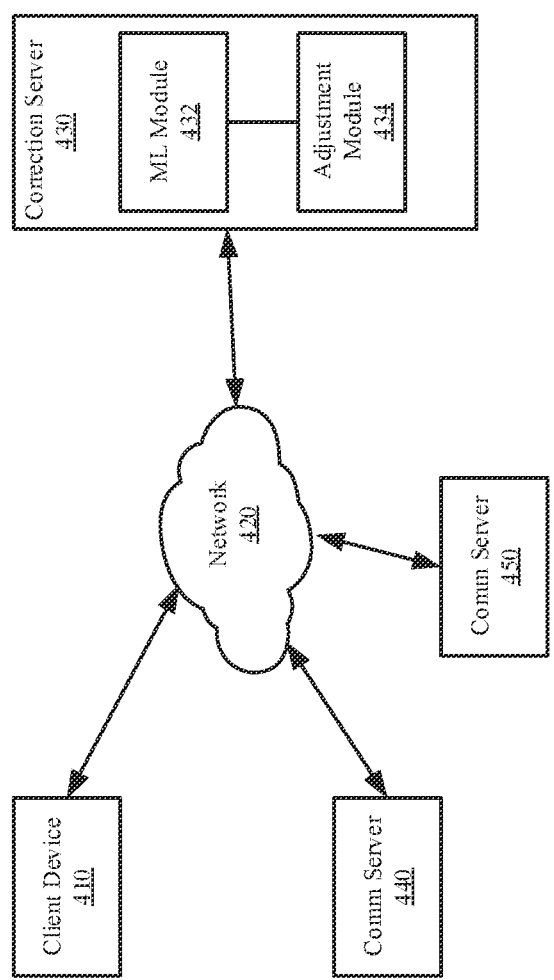
FIG. 4A is a diagram of a system for dynamic selection of appropriate error correction code and/or transcoding in accordance with some embodiments of the present disclosure.

Referring now to FIG. 4A, a diagram of a system for dynamic selection of appropriate error correction code and/or transcoding in accordance with some embodiments of the present disclosure. The client device 410 may be similar to device 120 described above. The client device 410 may be communicating with the communication server 440 via the network 420. The communication server 440 may be similar to the computing device 150 described above. The correction server 430 includes the ML module 432 (similar to the ML module 220) and an adjustment module 434. The ML module 432 include one or more ML models that have been trained (as described in FIGS. 2A-3). The correction server 430 may collect data associated with client device 410 (similar to the data that was collected in FIGS. 1A-1B) when the client device 410 is communicating with the communication server 440. The collected data by the correction server 430 is fed into the trained ML module 432 to use the ML model that has already been developed. In some embodiments, more than one ML model may exist and as such an appropriate ML model is identified and used. The output of the ML model (e.g., appropriate error correction code, appropriate redundancy to use, appropriate transcoding, etc.) is fed into the adjustment module 434 such that the selected code based on the ML model can be transmitted to the client device 410. In one optional embodiment, the adjustment module 434 may receive the output of the ML Model and determine whether any changes need to be made. For example, the adjustment module 434 may compare the type of error correcting code to be used as determined by the ML module 432 with what is being used (if any) in communication with the client device 410. If there is a mismatch, then the adjustment module 434 may cause communication with client device 410 to be injected with the identified error correcting code, as determined by the ML module 432. If there is a match, then no adjustment may be needed. In other embodiments, the adjustment module 434 is configured to send the selected error correcting code to a client device. A similar process takes place to determine whether the appropriate redundancy percentages are being used for the appropriate error correcting codes, as determined by the ML module 432. A similar process also takes place to determine whether the appropriate transcoding is being used.

In this nonlimiting example, the correction server 430 may determine that changes are necessary with respect to the error correcting code, percentage of the redundancy, and/or transcoding to be used. As such, the correction server 430 may inject the client device 410 and/or the source with the appropriate code, e.g., error correcting code, appropriate redundancy, etc., and/or cause the source to use the identified transcoding when communicating with the client device 410. In some examples, the correction server 430 may cause the communication with the client device 410 via the communication server 440 to be terminated and to be transferred to communication server 450 that is more suited for communication based on the determination of the error correcting code, percentages of redundancy, and/or transcoding. Accordingly, communication is improved, and data reliability is increased.

Figure 4B:
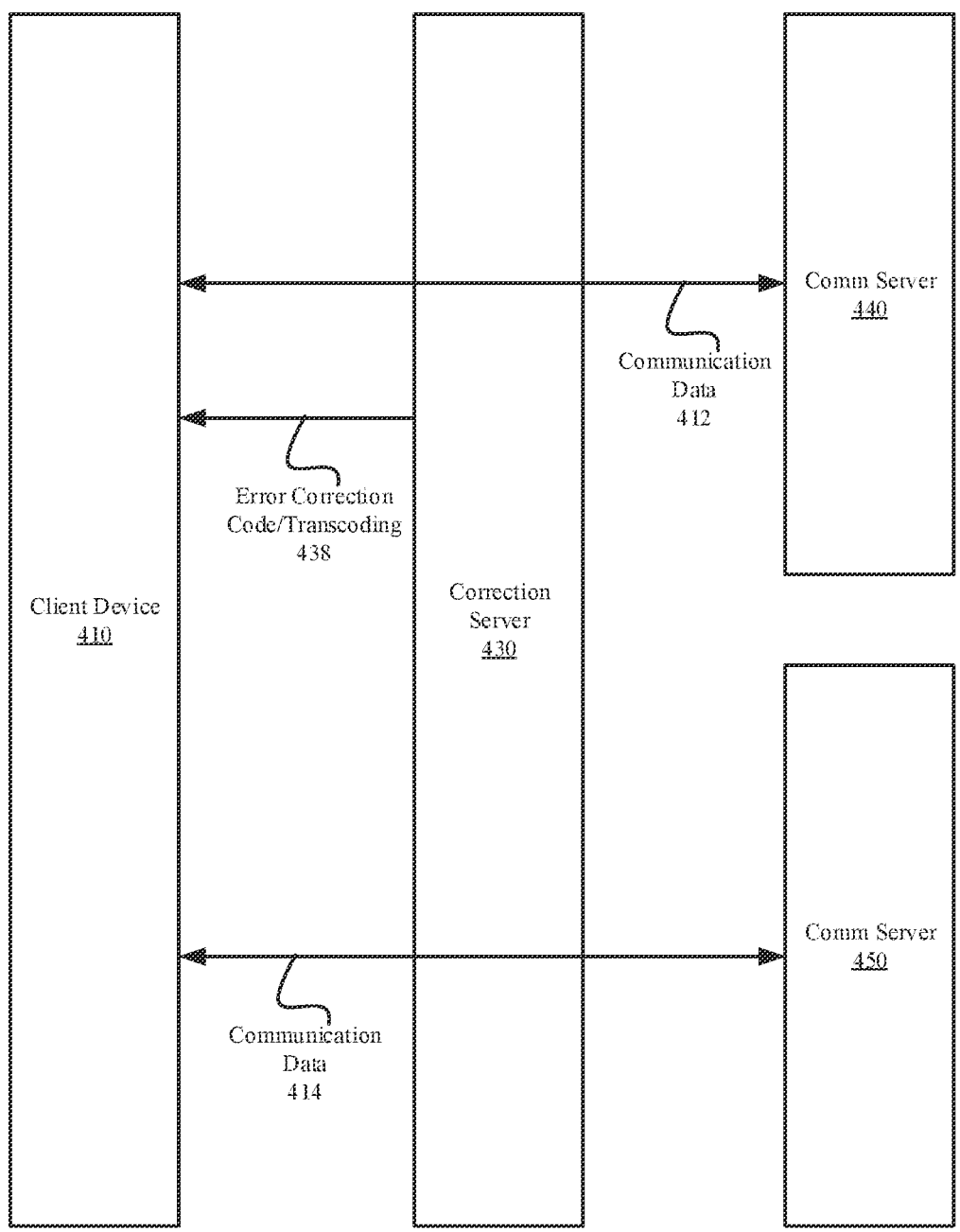
FIG. 4B is a diagram of a communication in a system for dynamic selection of appropriate error correction code and/or transcoding in accordance with some embodiments of the present disclosure.

Referring now to FIG. 4B, a diagram of a communication in a system for dynamic selection of appropriate error correction code and/or transcoding in accordance with some embodiments of the present disclosure. FIG. 4B illustrates the communication taking place between the client device 410, the correction server 430, the communication server 440, and communication server 450, as described in FIG. 4A. In this example, the client device 410 is communicating (e.g., communication data 412) with communication server 440. It is appreciated that the correction server 430 may monitor and collect certain data (as described above) associated with the client device 410. It is appreciated that the client device 410 may be mobile and change its location, resulting in poor connection, as an example. In some embodiments, the correction server 430 monitoring the data (as described in FIGS. 1A-3) utilizes the data and changes in data to identify the appropriate ML model to use. Once the appropriate model is selected, the appropriate error correcting code (and/or percentage of redundancy) and/or transcoding to use can be determined. In this nonlimiting example, the correction server 430 injects the client device 410 with the appropriate error correction code and/or transcoding 438. Moreover, the correction server 430 may determine that using the communication server 440 is no longer appropriate for the client device 410 and as such cause the service to be transferred to communication server 450 instead (using a more suitable transcoding and/or error correcting code). As such, the client device 410 may continue its communication (e.g., communication data 414) but via communication server 450 instead of the communication server 440.

It is appreciated that the embodiments generate one or more ML models based on various factors (as described above) associated with a device at a particular location. In other words, various ML models are generated for each location and further based on other factors, e.g., device type, time of day, etc., as described above. The collected information from a device, e.g., device 120, may be collected and the appropriate ML model from the generated ML models may be selected to adaptively and dynamically determine the appropriate error correcting code (e.g., type of code and/or redundancy percentage) to improve data reliability and/or appropriate transcoding (to reduce bandwidth for example by determining the video format best suited based on factors associated with the device such as location), based on various factors (as described above) associated with a particular device. It is appreciated that devices associated with different users may be classified based on their location into one or more categories, e.g., low packet loss rates, medium packet loss rates, high packet loss rates, etc. In one nonlimiting example, the location classification of a device may be used by the source to adjust the error correcting code accordingly, e.g., based on whether the device is in a low packet loss area, etc. In some embodiments, the ML model coverage map may be learned from crowd source reporting events and in some embodiments the users may provide feedback with respect to their location, e.g., 3D location, and their respective device types. It is appreciated that the proposed approach enables Unified Communication as a Service (UCaaS) platforms that use SFU or MCU, frontend applications, etc., to characterize the environment for better and improved traffic optimization, thereby improving data reliability and QOE while reducing re-transmission requests.

Figure 5A:
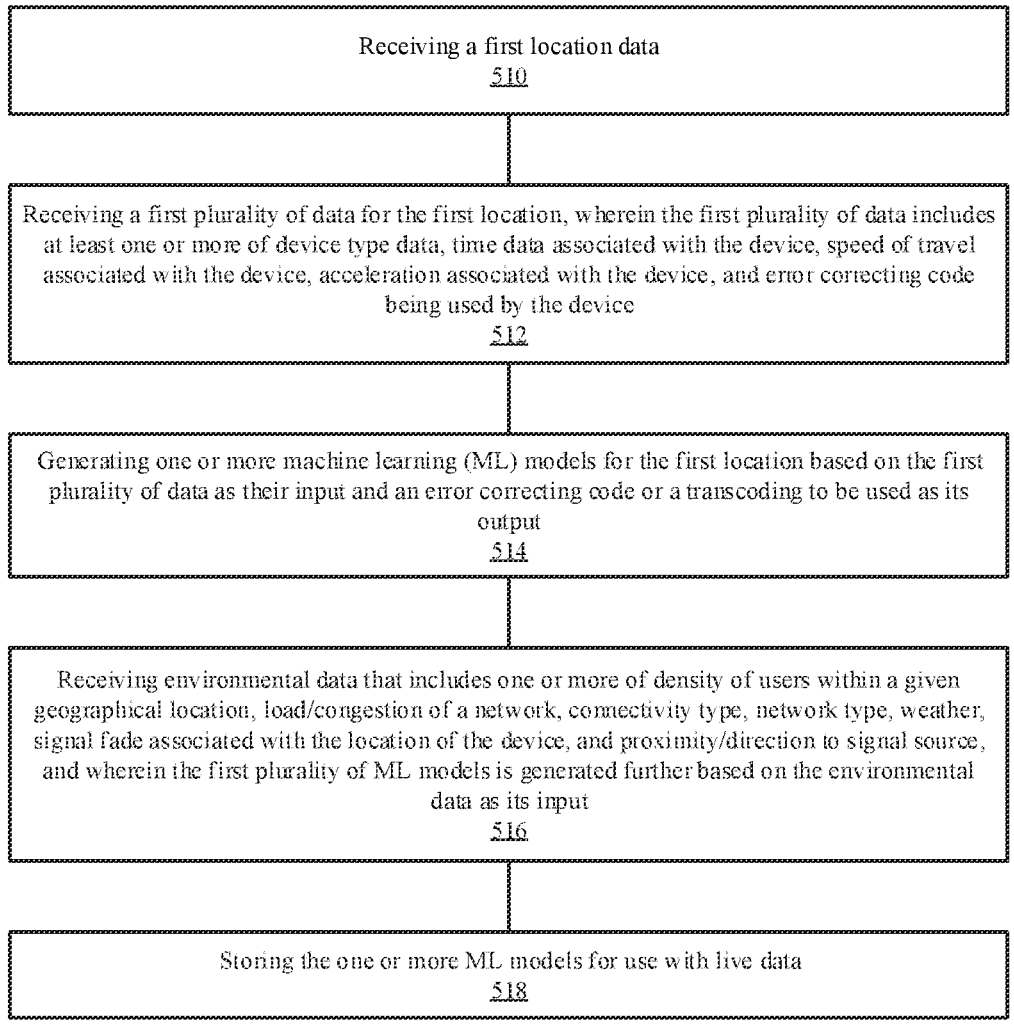
FIG. 5A is a flow chart of a method for generating one or more ML models for dynamic selection of appropriate error correction code and/or transcoding in accordance with some embodiments of the present disclosure.

FIG. 5A is a flow chart of a method for generating one or more ML models for dynamic selection of appropriate error correction code and/or transcoding in accordance with some embodiments of the present disclosure. At step 510, a first location data is received, e.g., location of a device, as described in FIGS. 2A-2B and 3. At step 512, a first plurality of data is received for the first location, as described in FIGS. 2A-2B and 3. The first plurality of data includes at least one or more of device type data, time data associated with the device, speed of travel associated with the device, acceleration associated with the device, and error correcting code being used by the device. At step 514, at least one or more ML model is generated for the first location based on the first plurality of data as their input and an error correcting code, e.g., FEC and its percentage of redundancy, or a transcoding to be used as its output. In one nonlimiting the process is repeated for a second location data. At step 516, environmental data is received and it includes one or more of density of users within a given geographical location, load/congestion of a network, connectivity type, network type, weather, signal fade associated with the location of the device, and proximity/direction to signal source, and wherein the one or more ML models is generated further based on the environmental data as its input. At step 518, the first plurality of ML models may be stored in a memory component for later use with live data.

Figure 5B:
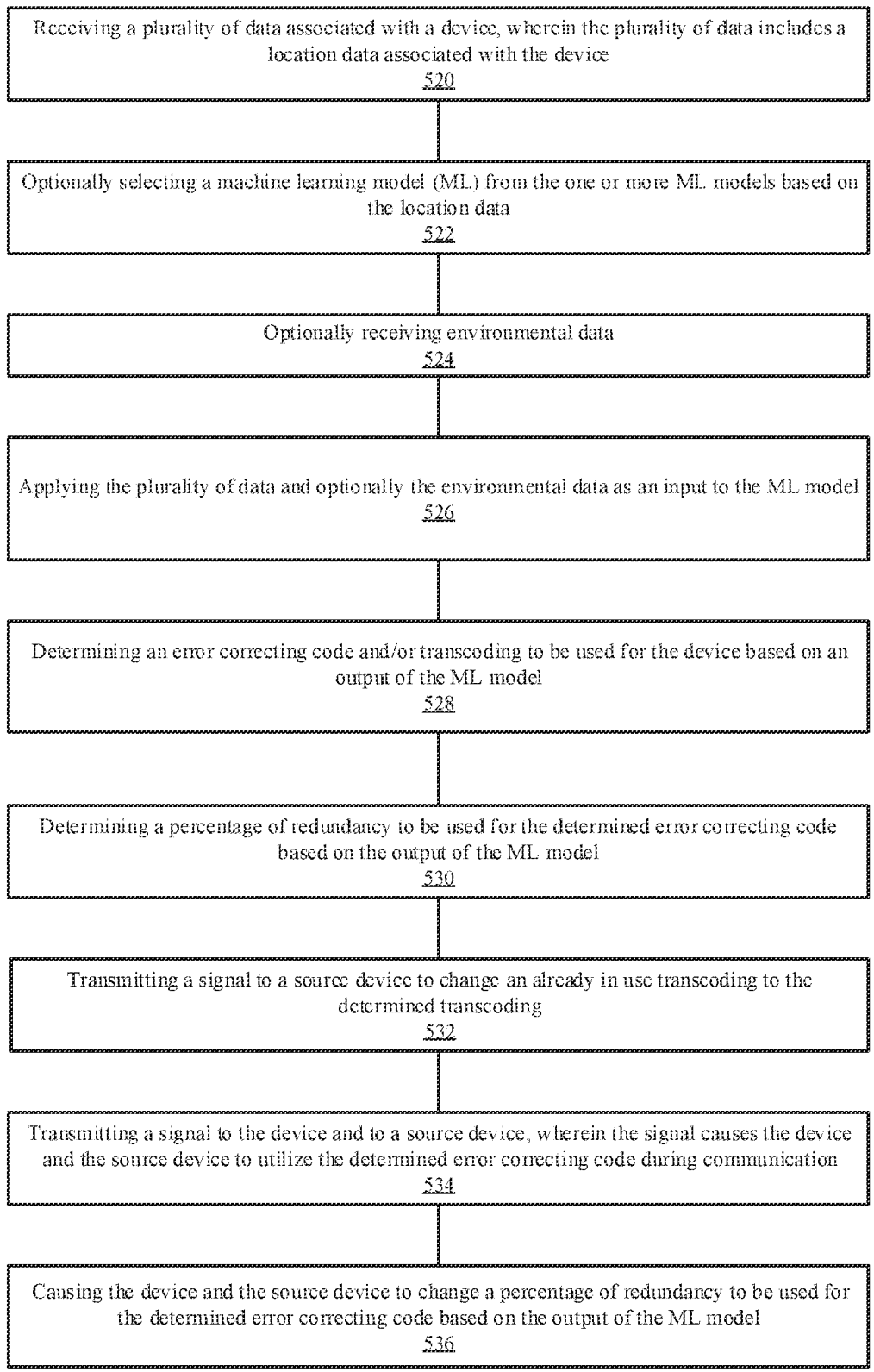
FIG. 5B is a flow chart of a method for applying one or more ML models for dynamic selection of appropriate error correction code and/or transcoding in accordance with some embodiments of the present disclosure.

FIG. 5B is a flow chart of a method for applying one or more ML models for dynamic selection of appropriate error correction code and/or transcoding in accordance with some embodiments of the present disclosure. At step 520 a plurality of data associated with a device is received. The plurality of data includes a location data associated with the device. It is appreciated that the plurality of data may include one or more of device type data, time data associated with the device, speed of travel associated with the device, acceleration associated with the device, and error correcting code being used by the device. At step 522, optionally, a ML model is selected from a plurality of ML models based on the location data. At step 524, optionally environmental data is received. The environmental data may include one or more of density of users within a given geographical location, load/congestion of a network, connectivity type, network type, weather, signal fade associated with the location of the device, and proximity/direction to signal source. At step 526, the plurality of data is applied as an input to the trained ML model. At step 528, an error correcting code (e.g., FEC) and/or transcoding to be used for the device based on an output of the selected ML model. In some embodiments, at step 530, a percentage of redundancy to be used for the determined error correcting code is determined based on the output of the selected ML model. It is appreciated that the applying of the ML model and the determining in steps 526-530 may further be based on the received environmental data. At step 532, a signal is optionally transmitted to a source device to change an already in use transcoding to the determined transcoding. At step 534, a signal is transmitted to the device and to a source device that causes the device and the source device to utilize the determined error correcting code during communication. In some optional embodiments, at step 536, the device and the source device are caused (e.g., instructed) to change a percentage of redundancy to be used for the determined error correcting code based on the output of the selected ML model.

Figure 6:
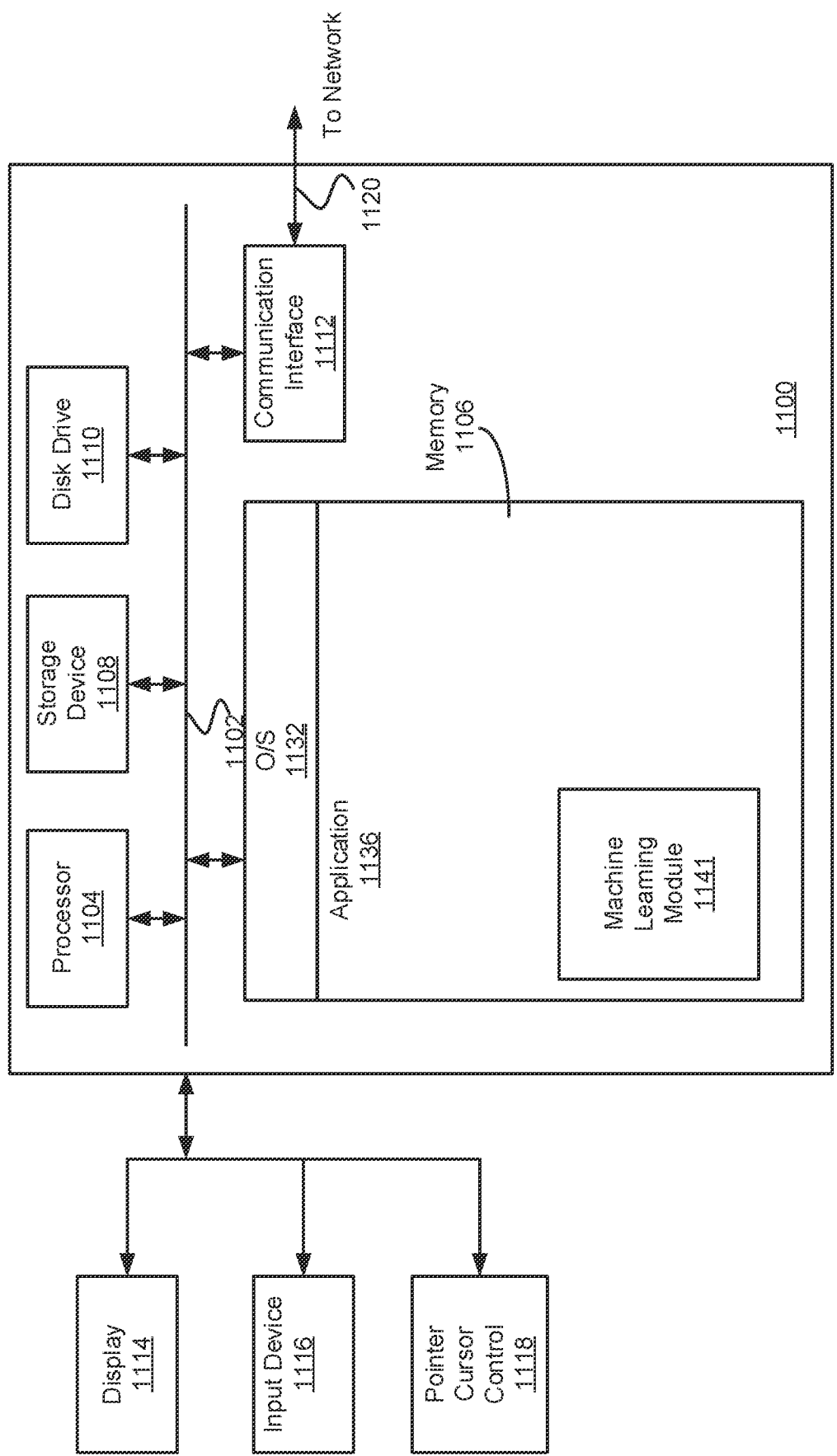
FIG. 6 is a block diagram depicting an example of computer system suitable for dynamic selection of appropriate error correction code and/or transcoding in accordance with some embodiments.

FIG. 6 is a block diagram depicting an example of computer system suitable for dynamic selection of error correction code and/or transcoding for a given user based on various factors in accordance with some embodiments. In some examples, computer system 1100 can be used to implement computer programs, applications, methods, processes, or other software to perform the above-described techniques and to realize the structures described herein. Computer system 1100 includes a bus 1102 or other communication mechanism for communicating information, which interconnects subsystems and devices, such as a processor 1104, a system memory ("memory") 1106, a storage device 1108 (e.g., ROM), a disk drive 1110 (e.g., magnetic or optical), a communication interface 1112 (e.g., modem or Ethernet card), a display 1114 (e.g., CRT or LCD), an input device 1116 (e.g., keyboard), and a pointer cursor control 1118 (e.g., mouse or trackball). In one embodiment, pointer cursor control 1118 invokes one or more commands that, at least in part, modify the rules stored, for example in memory 1106, to define the electronic message preview process.

According to some examples, computer system 1100 performs specific operations in which processor 1104 executes one or more sequences of one or more instructions stored in system memory 1106. Such instructions can be read into system memory 1106 from another computer readable medium, such as static storage device 1108 or disk drive 1110. In some examples, hard-wired circuitry can be used in place of or in combination with software instructions for implementation. In the example shown, system memory 1106 includes modules of executable instructions for implementing an operating system ("OS") 1132, an application 1136 (e.g., a host, server, web services-based, distributed (i.e., enterprise) application programming interface ("API"), program, procedure or others). Further, application 1136 includes a module of executable instructions for generating one or more ML models that can be used with live data to dynamic select and error correction code and/or transcoding for a given user based on various factors.

The term "computer readable medium" refers, at least in one embodiment, to any medium that participates in providing instructions to processor 1104 for execution. Such a medium can take many forms, including but not limited to, non-volatile media, volatile media, and transmission media. Non-volatile media includes, for example, optical or magnetic disks, such as disk drive 1110. Volatile media includes dynamic memory, such as system memory 1106. Transmission media includes coaxial cables, copper wire, and fiber optics, including wires that comprise bus 1102. Transmission media can also take the form of acoustic or light waves, such as those generated during radio wave and infrared data communications.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, electromagnetic waveforms, or any other medium from which a computer can read.

In some examples, execution of the sequences of instructions can be performed by a single computer system 1100. According to some examples, two or more computer systems 1100 coupled by communication link 1120 (e.g., LAN, PSTN, or wireless network) can perform the sequence of instructions in coordination with one another. Computer system 1100 can transmit and receive messages, data, and instructions, including program code (i.e., application code) through communication link 1120 and communication interface 1112. Received program code can be executed by processor 1104 as it is received, and/or stored in disk drive 1110, or other non-volatile storage for later execution. In one embodiment, system 1100 is implemented as a hand-held device. But in other embodiments, system 1100 can be implemented as a personal computer (i.e., a desktop computer) or any other computing device. In at least one embodiment, any of the above-described delivery systems can be implemented as a single system 1100 or can implemented in a distributed architecture including multiple systems 1100.

In other examples, the systems, as described above can be implemented from a personal computer, a computing device, a mobile device, a mobile telephone, a facsimile device, a personal digital assistant ("PDA") or other electronic device.

In at least some of the embodiments, the structures and/or functions of any of the above-described interfaces and panels can be implemented in software, hardware, firmware, circuitry, or a combination thereof. Note that the structures and constituent elements shown throughout, as well as their functionality, can be aggregated with one or more other structures or elements.

Alternatively, the elements and their functionality can be subdivided into constituent sub-elements, if any. As software, the above-described techniques can be implemented using various types of programming or formatting languages, frameworks, syntax, applications, protocols, objects, or techniques, including C, Objective C, C++, C#, Flex. TM., Fireworks. RTM., Java. TM., Javascript. TM., AJAX, COBOL, Fortran, ADA, XML, HTML, DHTML, XHTML, HTTP, XMPP, and others. These can be varied and are not limited to the examples or descriptions provided.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A computer-implemented method, comprising:
   receiving a plurality of data associated with a device, wherein the plurality of data includes a location data associated with the device;
   applying the plurality of data as an input to a trained Machine Learning (ML) model to determine an error correcting code to be used for the device based on an output of the ML model;
   sending the error correcting code to the device;
   determining a transcoding to be used for the device as a parameter of the determined error correcting code; and
   transmitting a signal to a source device to change an already in use transcoding to the determined transcoding.

2. The computer-implemented method of claim 1, wherein the error correcting code is forward error correction (FEC).

3. The computer-implemented method of claim 1, further comprising determining a percentage of redundancy as a parameter of the determined error correcting code.

4. The computer-implemented of claim 1, further comprising receiving environmental data that includes one or more of density of users within a given geographical location, load or congestion of a network, connectivity type, network type, weather, signal fade associated with the location of the device, and proximity/direction to signal source, and wherein the applying and the determining is further based on the environment data.

5. The computer-implemented of claim 1, wherein the plurality of data includes one or more of device type data, time data associated with the device, speed of travel associated with the device, acceleration associated with the device, and error correcting code being used by the device.

6. The computer-implemented method of claim 1, further comprising:
   transmitting a signal to the device and to a source device, wherein the signal causes the device and the source device to utilize the determined error correcting code during communication; and
   causing the device and the source device to change a percentage of redundancy to be used in association with the determined error correcting code.

7. The computer-implemented method of claim 1, further comprising selecting a machine learning model (ML) from a plurality of ML models based on the location data.

8. A non-transitory, computer-readable medium storing a set of instructions that, when executed by a processor, cause:
   receiving a plurality of data associated with a device, wherein the plurality of data includes a location data associated with the device;
   applying the plurality of data as an input to a trained Machine Learning (ML) model to determine an error correcting code to be used for the device based on an output of the ML model;
   sending the error correcting code to the device;
   determining a transcoding to be used for the device as a parameter of the determined error correcting code; and
   transmitting a signal to a source device to change an already in use transcoding to the determined transcoding.

9. The non-transitory, computer-readable medium of claim 8, wherein the error correcting code is forward error correction (FEC).

10. The non-transitory, computer-readable medium of claim 8, wherein when executed by a processor, further causes determining a percentage of redundancy as a parameter of the determined error correcting code.

11. The non-transitory, computer-readable medium of claim 8, wherein when executed by a processor, further causes receiving environmental data that includes one or more of density of users within a given geographical location, load or congestion of a network, connectivity type, network type, weather, signal fade associated with the location of the device, and proximity/direction to signal source, and wherein the applying and the determining is further based on the environment data.

12. The non-transitory, computer-readable medium of claim 8, wherein the plurality of data includes one or more of device type data, time data associated with the device, speed of travel associated with the device, acceleration associated with the device, and error correcting code being used by the device.

13. A system comprising:
a memory storing a set of instructions; and
at least one processor configured to execute the instructions to:
receive a plurality of data associated with a device, wherein the plurality of data includes a location data associated with the device;
apply the plurality of data as an input to a trained Machine Learning (ML) model to determine an error correcting code to be used for the device based on an output of the ML model;
send the error correcting code to the device;
determine a transcoding to be used for the device as a parameter of the determined error correcting code; and
transmit a signal to a source device to change an already in use transcoding to the determined transcoding.

14. The system of claim 13, wherein the error correcting code is forward error correction (FEC).

15. The system of claim 13, wherein the at least one processor is configured to execute the instructions to determine a percentage of redundancy as a parameter of the determined error correcting code.

16. The system of claim 13, wherein the at least one processor is configured to execute the instructions to receive environmental data that includes one or more of density of users within a given geographical location, load or congestion of a network, connectivity type, network type, weather, signal fade associated with the location of the device, and proximity/direction to signal source, and wherein the applying and the determining is further based on the environment data.

17. The system of claim 13, wherein the plurality of data includes one or more of device type data, time data associated with the device, speed of travel associated with the device, acceleration associated with the device, and error correcting code being used by the device.

* * * * *

UNITED STATES PATENT AND TRADEMARK OFFICE
CERTIFICATE OF CORRECTION

| | | |
|---|---|---|
| PATENT NO. | : 12,278,651 B2 | Page 1 of 1 |
| APPLICATION NO. | : 18/089947 | |
| DATED | : April 15, 2025 | |
| INVENTOR(S) | : Mostafa Tofighbakhsh, Vlad Vendrow and Homayoun Razavi et al. | |

It is certified that error appears in the above-identified patent and that said Letters Patent is hereby corrected as shown below:

In the Specification

Column 10 Line 18 Should read as follows:
At time t1 subsequent to t0

Signed and Sealed this
Twenty-fourth Day of June, 2025

Coke Morgan Stewart
*Acting Director of the United States Patent and Trademark Office*